United States Patent [19]

Sung

[11] Patent Number: 5,573,962
[45] Date of Patent: Nov. 12, 1996

[54] LOW CYCLE TIME CMOS PROCESS

[75] Inventor: Janmye Sung, Yang-Mei, Taiwan

[73] Assignee: Vanguard International Semiconductor Corporation, Hsin-Chu, Taiwan

[21] Appl. No.: 572,810

[22] Filed: Dec. 15, 1995

[51] Int. Cl.⁶ .................................... H01L 21/8238
[52] U.S. Cl. ................... 437/34; 437/29; 437/57; 437/164; 437/931
[58] Field of Search .................. 437/34, 56, 57, 437/58, 41 RCM, 28, 29, 931, 164; 148/Dig. 106

[56] References Cited

U.S. PATENT DOCUMENTS

| | | | |
|---|---|---|---|
| 4,732,869 | 3/1988 | Van Attekum et al. | 437/34 |
| 5,019,520 | 5/1991 | Komori et al. | 437/34 |
| 5,134,085 | 7/1992 | Gilgen et al. | 437/52 |
| 5,160,996 | 11/1992 | Odanaka | 257/375 |
| 5,173,440 | 12/1992 | Tsunashima et al. | 437/164 |
| 5,393,677 | 2/1995 | Lien et al. | 437/34 |
| 5,460,984 | 10/1995 | Yoshida | 437/28 |
| 5,501,993 | 3/1996 | Borland | 437/34 |
| 5,525,532 | 6/1996 | Kim | 437/34 |

*Primary Examiner*—Michael Trinh
*Attorney, Agent, or Firm*—George O. Saile

[57] ABSTRACT

A process for fabricating CMOS devices has been developed, in which decreased cycle time has been achieved, via a reduction in photomasking steps. The low cycle time CMOS process features the use of only one photo mask to create both the lightly doped, as well as the heavily doped N type, source and drain regions, by performing both implantations, after creation of the insulator sidewall spacer. In addition the P type source and drain regions are formed, using an oxide layer as a blockout for the P well region, thus eliminating the use of another photomasking procedure.

30 Claims, 8 Drawing Sheets

LOW CYCLE TIME CMOS PROCESS

BACKGROUND OF THE INVENTION

(1) FIELD OF THE INVENTION

The present invention relates to the fabrication of semiconductor devices, and more specifically to a process for fabricating complimentary metal oxide semiconductor, (CMOS), devices.

(2) DESCRIPTION OF PRIOR ART

The semiconductor industry is continually striving to improve the performance of silicon devices, while still maintaining or even reducing the cost of manufacturing higher performing silicon chips. These objectives have been realized, in part, by micro-miniaturazation, or the ability of the semiconductor industry to reduce the dimensions of key features of the silicon device. The ability of the semiconductor industry to produce sub-micron features has allowed smaller silicon chips to result, thus allowing more chips per starting substrate, ultimately reducing the cost of individual chips. The reduction in the dimensions of key silicon device features has also resulted in performance benefits, realized via reductions in performance degrading capacitances and resistances. Micro-miniaturazation has been accomplished by the advances in several semiconductor fabrication disciplines, such as photolithography and dry etching. The development of more sophisticated exposure cameras, as well as the use of more sensitive photoresist materials, have resulted in the attainment of sub-micron images in photoresist. Similar advancements in the dry etching discipline has allowed the sub-micron images in photoresist to be successfully transferred to underlying materials, used for the fabrication of advanced semiconductor devices.

However, the objective of cost reduction can only be partially achieved via micro-miniaturazation. Significant cost reductions can also be realized by reducing the complexity and cycle time used to fabricate semiconductor devices. Reductions in the number of photomasking steps used to produce the desired device can result in the desired device cost reduction. For example Gilgen, et al, in U.S. Pat. No. 5,134,085, describe a dynamic random access memory, (DRAM), process in which significant reductions in photomasking have been applied, resulting in a DRAM device, fabricated at a lower cost then counterparts using a greater number of photomasking process steps. This invention will describe a CMOS process in which only six photomasking steps are used to produce CMOS devices, through first metal processing. This is accomplished by the use of a high energy ion implantation twin-tub process, a single mask lightly doped, and heavily doped, N type source and drain region, and a self-aligned P+ source and drain formation technique.

SUMMARY OF THE INVENTION

It is an object of this invention to provide a low cycle time process for fabricating CMOS devices.

It is another object of this invention to reduce the number of photomasking steps used to produce the CMOS devices.

It is yet another object of this invention to use a single mask to create both the N well and P well areas using a self-aligned, high energy ion implantation process.

It is still yet another object of this invention to use a self-aligned P type, source and drain region.

In accordance with the present invention a process is described for fabricating CMOS devices, using a minimum of photomasking steps. After creation of thick silicon dioxide regions, used for isolation purposes, self-aligned, P well and N well regions are created using a single photomasking step. A blanket threshold voltage ion implantation step is next performed, followed by growth of a thin gate insulator. Deposition of polysilicon, doping of the polysilicon layer, and reactive ion etching, are used to create the polysilicon gate electrode. Sidewall insulator spacers are formed on the polysilicon gate electrode, followed by photomasking blockout of the N well region. An N type, lightly doped, source and drain region is formed, in the P well region, via a large angle tilt, ion implantation procedure, followed by another N type ion implantation step, using a standard implantation angle, used to create the heavily doped source and drain regions. After photoresist removal, silicon dioxide is grown at a temperature that results in significantly thicker oxides on the N+ source and drain regions, in the P well region, than on the exposed surfaces of the N well region. A photomasking step can then be used to blockout the oxide on the N+ source and drain regions, while removing the thin silicon dioxide layer from the surface of the N well region, via wet etching procedures. An alternative method, saving a photomasking step, is to use a controlled wet etch to completely remove the thin oxide layer from the N well regions, while leaving a significant portion of the thicker oxide on the N+ source and drain regions, in the P well region. For either case a borosilicate glass, (BSG), is next deposited, directly interfacing the exposed N well regions, while separated from the N+ source and drain regions via the silicon dioxide layer. Rapid thermal annealing then drives boron, from the BSG layer, into the exposed regions of the N well region, to create the P+ source and drain areas. Diffusion of boron into the N+ source and drain regions is blocked by the silicon dioxide layer on the N+ source and drain surface. After removal of the BSG layer, a thick intermetal level dielectric layer is deposited, followed by a dual contact hole opening, requiring two photomasking steps, and providing a contact hole consisting of a narrow opening to source and drain regions, and a wider opening for subsequent metallizations. A metallization is deposited, followed by either selective reactive ion etching, or chemical mechanical polishing, used to create the damascene metal structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricated CMOS devices, using a reduction in photomasking steps, and resulting in ultra low cycle times, will now be described. The CMOS device being described is currently being manufactured in industry, therefore only specific areas of the CMOS fabrication process, unique to understanding this invention, will be covered in detail.

Figure 1:
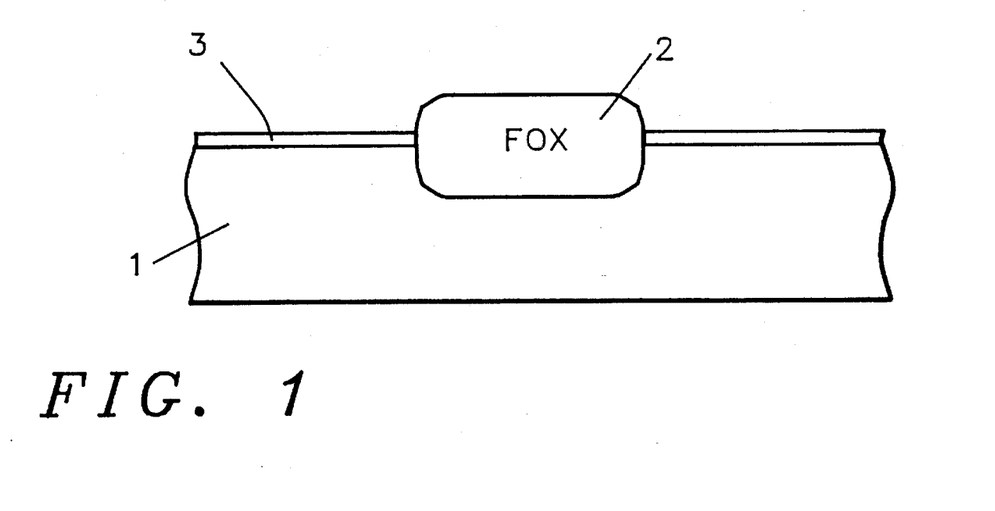
FIGS. 1–3 and 4a–4c which schematically, in cross-sectional style, show the formation of the P and N well regions.

A P type, single crystal substrate, 1, with a <100> crystallographic orientation is used. A thick field oxide region, 2, (FOX), is created for purposes of isolating subsequent P channel metal oxide semiconductor field effect transistors, (MOSFET), devices, from subsequent N channel, MOSFET devices. Briefly the method used to create FOX region, 2, is to pattern, via standard photolithography and dry etching procedures, a silicon nitride—silicon dioxide composite layer. After photoresist removal, and careful wet cleans, a thermal oxidation, in an oxygen—steam ambient, is performed, using the patterned silicon nitride—silicon dioxide composite layer as an oxidation mask, at a temperature between about 850° to 1050° C., to produce a silicon dioxide, FOX, layer, 2, at a thickness between about 4000 to 6000 Angstroms. The removal of the oxidation masking composite layer is accomplished via use of hot phosphoric acid, for the silicon nitride layer, and a buffered hydrofluoric acid solution for the underlying silicon dioxide layer. A thin, pad, silicon dioxide layer, 3, is then regrown, in non-FOX regions, using an oxygen-steam ambient, at a temperature between about 850° to 1000° C., to a thickness between about 150 to 350 Angstroms. This is shown in FIG. 1.

Figure 2:
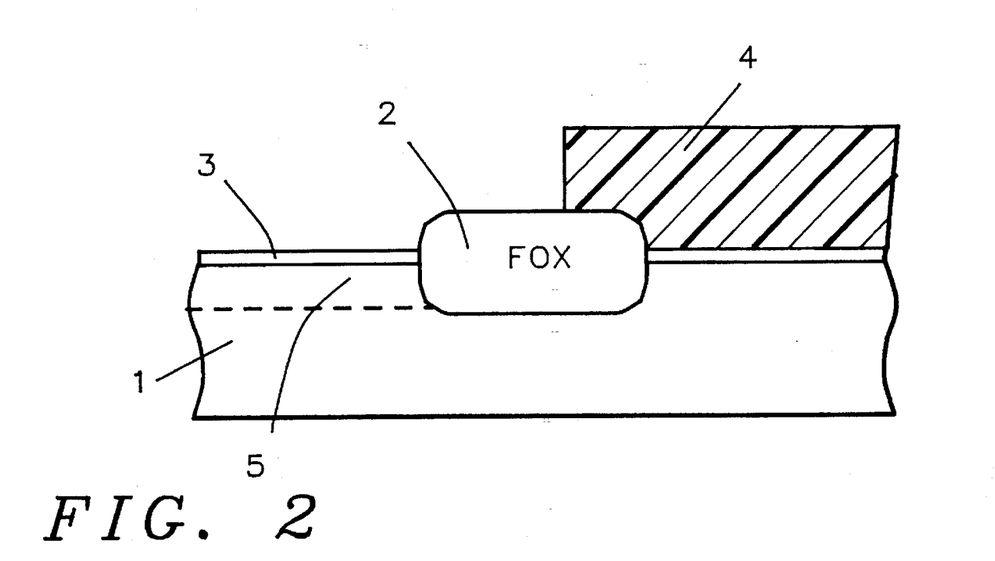
Figure 3:
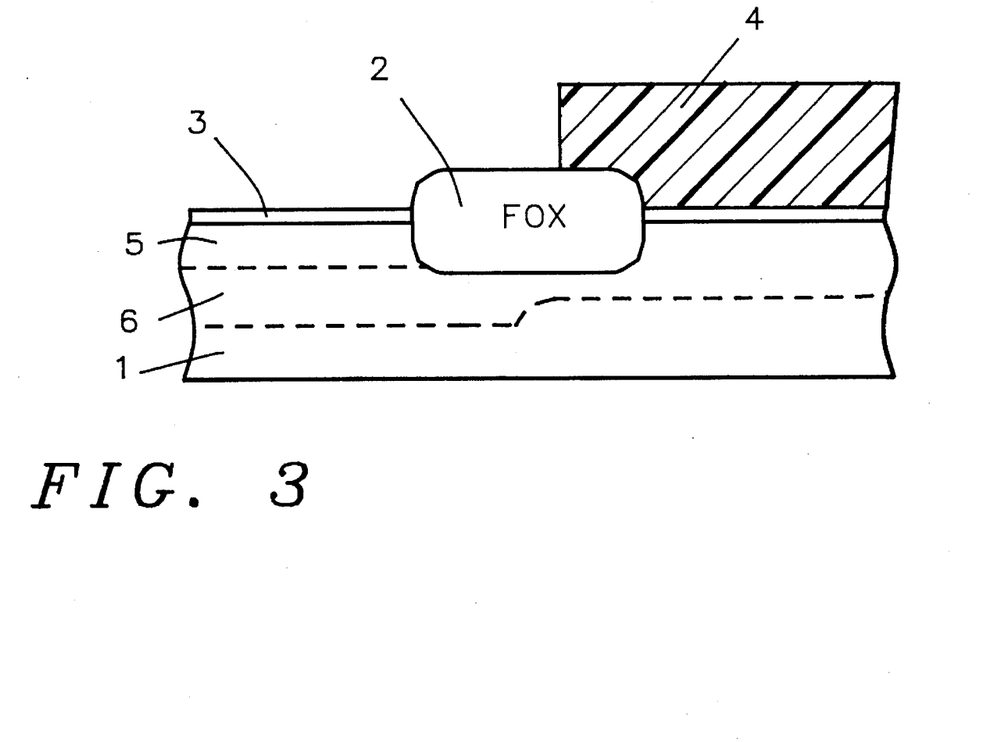
Figure 4A:
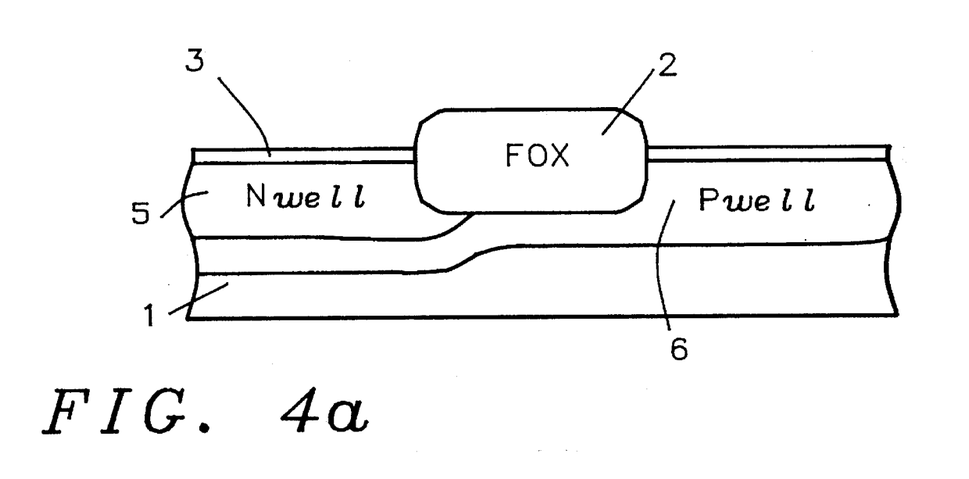

FIG. 2, shows photoresist blockout, 4, used to allow the creation of a subsequent N well region in a specific region of substrate, 1. The photoresist layer used to create photoresist blockout structure, 4, is applied to a thickness between about 10000 to 40000 Angstroms. An ion implantation of arsenic, at an energy between about 100 to 300 Kev., at a dose between about 1E11 to 1E12 atoms/$^2$, and phosphorous, at an energy between about 400 to 1000 Kev., at a dose between about 1E12 to 1E13 atoms/$^2$, is used to supply the needed dopants, 5, for the creation of the subsequent N well region. Another ion implantation, using boron, is now performed, at an energy between about 1000 to 2000 Kev., at a dose between about 1E12 to 1E13 atoms/$^2$, to supply the dopants, 6, needed for the formation of a subsequent P well region. This is shown schematically in FIG. 3. The energy used for the boron implantation has to be large enough to penetrate photoresist blockout, 4, in the subsequent P well region, and also large enough to place boron atoms below the N type dopants, 5 in the subsequent N well region. The use of this sequence allows both subsequent wells to be created using only one photomasking step. Photoresist removal is accomplished via plasma oxygen ashing, followed by careful wet cleans. A blanket threshold adjust, ion implantation step, using $BF_2$, at an energy between about 20 to 60 Kev., at a dose between about 1E11 to 1E12 atoms/$^2$, is performed to adjust the surface concentration of both N well and P well regions, that will enable the desired threshold voltages to be obtained. A rapid thermal anneal, (RTA), process, is then performed at a temperature between about 800° to 1000° C., for a time between about 15 to 60 seconds, to activate the implanted spices, and create N well region 5, and P well region, 6, shown in FIG. 4a.

Figure 4B:
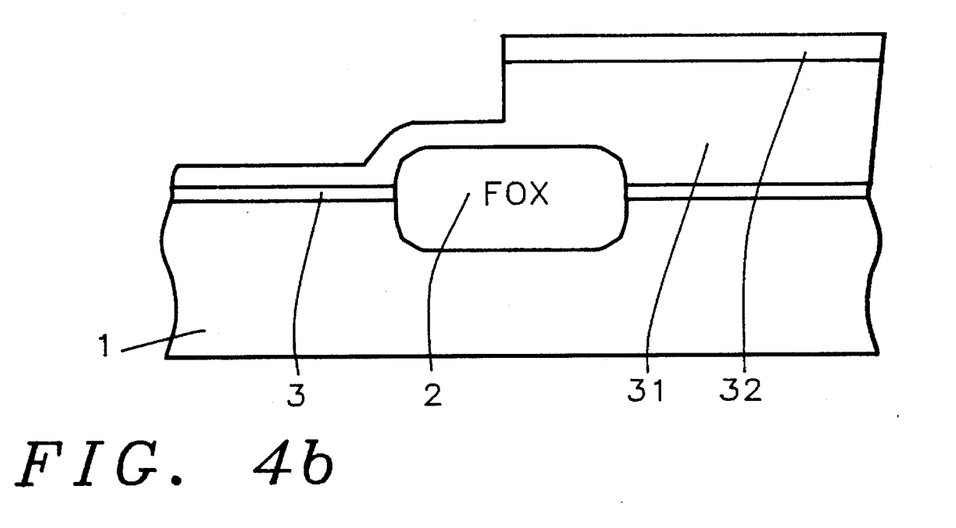
Figure 4C:
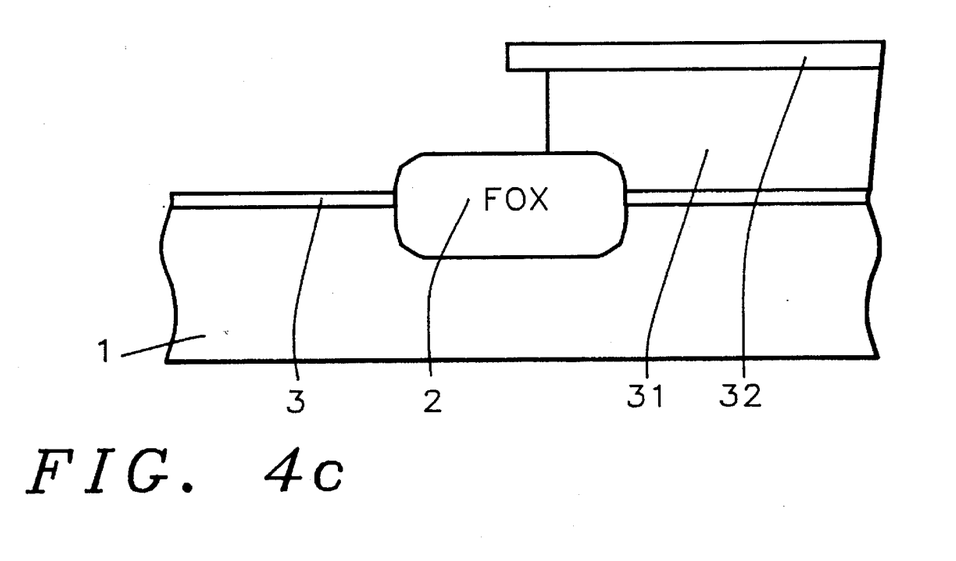

An alternative to using photoresist as a mask for blockout ion implantations, for N well and P well creation, a thick boro-phososilicate, (BPSG), layer can be substituted. The stopping effectiveness of the BPSG is twice that of photoresist, and thus a BPSG layer between about 5000 to 20000 Angstroms is used for the blockout application. The BPSG, 31, is obtained via LPCVD processing, followed by another LPCVD process depositing a layer of silicon nitride, 32, at a thickness between about 500 to 1000 Angstroms. After photolithographic and partial dry etching processing of the BPSG layer, the photoresist layer is removed. This is shown schematically in FIG. 4b. A selective wet etch is next employed to selectively remove the remaining BPSG layer from a region that will be subsequently used for N well creation. This is shown in FIG. 4c. The silicon nitride—BPSG composite, is then used as an ion implantation mask, for P well and N well formation, identically performed as shown previously for FIGS. 2–4a. The silicon nitride and BPSG layers are then removed via wet etching processing.

Figure 5:
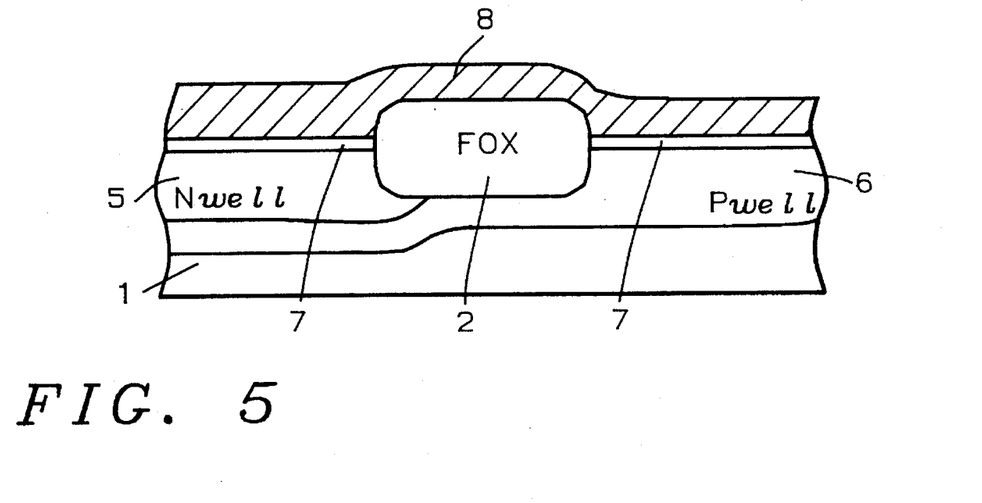
FIGS. 5–8, 9a–9b, and 10 which schematically, in cross-sectional style, show the formation of the source and drain regions for both the N channel and P channel devices.
Figure 6:
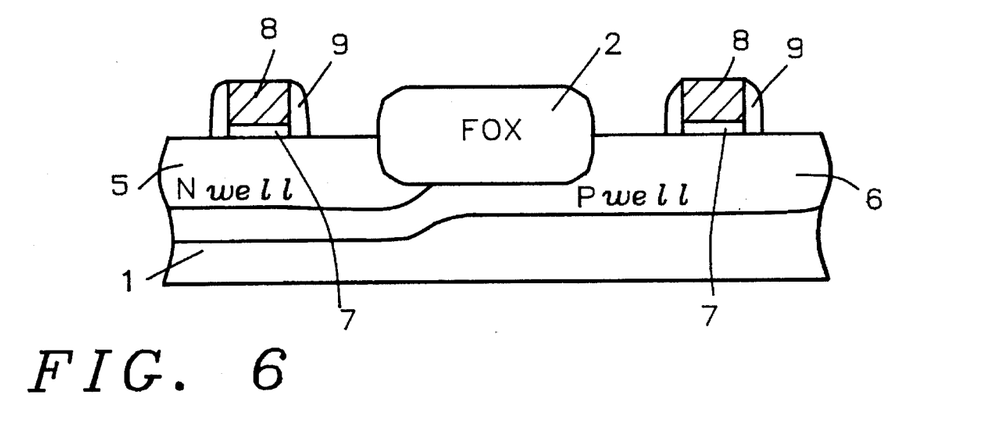

Silicon dioxide layer, 3, is next removed via a buffered hydrofluoric acid solution, followed by the growth of a silicon dioxide, gate insulator layer, 7, obtained via use of thermal oxidation in a oxygen-steam ambient, at a temperature between about 850° to 950° C., to a thickness between about 50 to 200 Angstroms. Polysilicon layer, 8, is then deposited using low pressure chemical vapor deposition, (LPCVD), processing, at a temperature between about 550° to 650° C., to a thickness between about 2000 to 4000 Angstroms. The polysilicon layer, 8, can either be grown using insitu doping techniques, via incorporation of $PH_3$ in the silane ambient, or the polysiliocn layer can be deposited intrinsically and doped via ion implantation of phosphorous, at an energy between about 50 to 100 Kev., at a dose between about 1E15 to 1E16 atoms/cm$^2$. This is shown in FIG. 5. Standard photolithographic and dry etching procedures, using a $Cl_2$ etchant, are used to produce polysilicon gate structure, 8. Photoresist is again removed via plasma oxygen ashing, followed by careful wet cleans. A layer of silicon oxide is next deposited, using either LPCVD or plasma enhanced chemical vapor deposition, (PECVD), processing, using tetraethylorthosilicate as a source at a temperature between about 400° to 700° C., to a thickness between about 1000 to 3000 Angstroms. A selective, anisotropic, reactive ion etching procedure, using $CHF_3$ as an etchant, is used to create insulator sidewall spacer, 9, shown schematically in FIG. 6.

Figure 7:
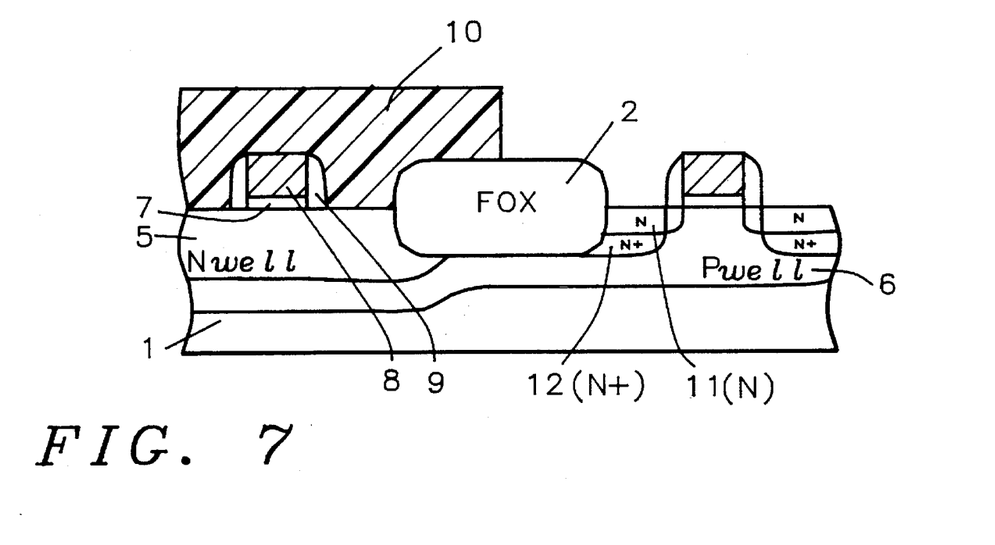

FIG. 7, shows the formation of the N channel, MOSFET device, including both lightly doped drains, (LDD), and heavily doped source and drain regions, using only one photomasking step. First a photoresist blockout, 10, is used to protect the N well region, 5, from the subsequent doping procedures. Next an ion implantation of phosphorous is performed at an energy between about 40 to 100 Kev., at a dose between about 1E13 to 1E14 atoms/$^2$, at an implant angle between about 30° to 60°. This large implant angle allows phosphorous to be implanted under insulator sidewall spacer, 9, creating the N type, LDD region, 11, in the P well region, 6. Next the heavily doped, N+source and drain regions, 12, are created via ion implantation of arsenic, at an energy between about 50 to 100 Kev., at a dose between about 1E15 to 5E15 atoms/$^2$, and at angle of only between about 0° to 7°. Photoresist removal is accomplished again using plasma oxygen ashing, followed by careful wet cleans.

Figure 8:
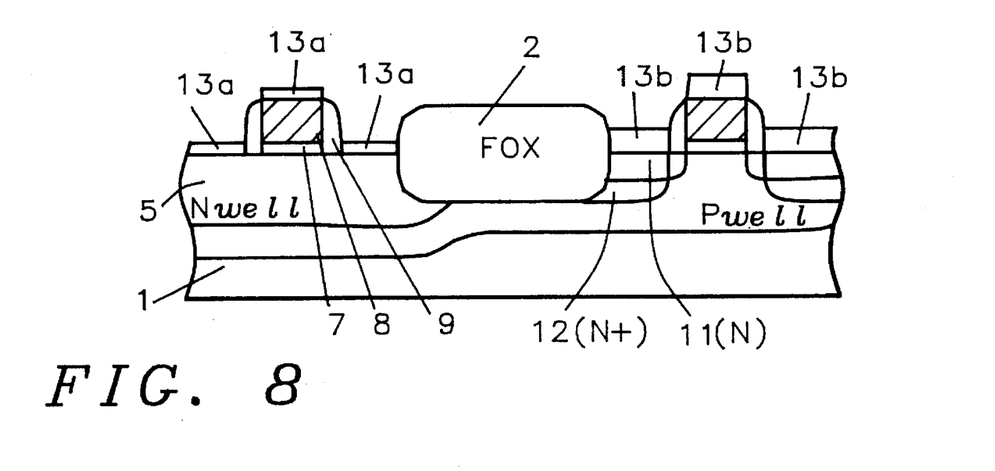

The creation of the heavily doped, P+ source and drain regions, for the P channel device, in N well region, 5, is next addressed. A thermal oxidation is performed to produce silicon dioxide layer, 13a, over the N type surface, in N well region, 5, and silicon dioxide layer, 13b, on the heavily doped N+, source and drain region, 12. The differential in silicon dioxide thickness is strongly dependent on oxidation temperature, therefore a temperature between about 600° to 800° C., was used to produce silicon dioxide layer, 13a, at thickness between about 100 to 200 Angstroms, and silicon dioxide layer, 13b, at a thickness between about 400 to 800 Angstroms. This is shown schematically in FIG. 8.

Figure 9A:
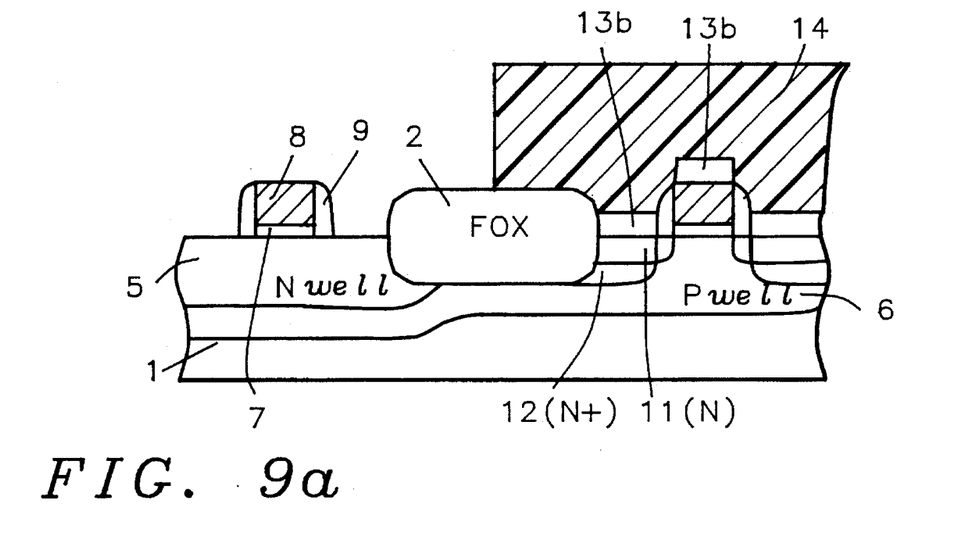
Figure 9B:
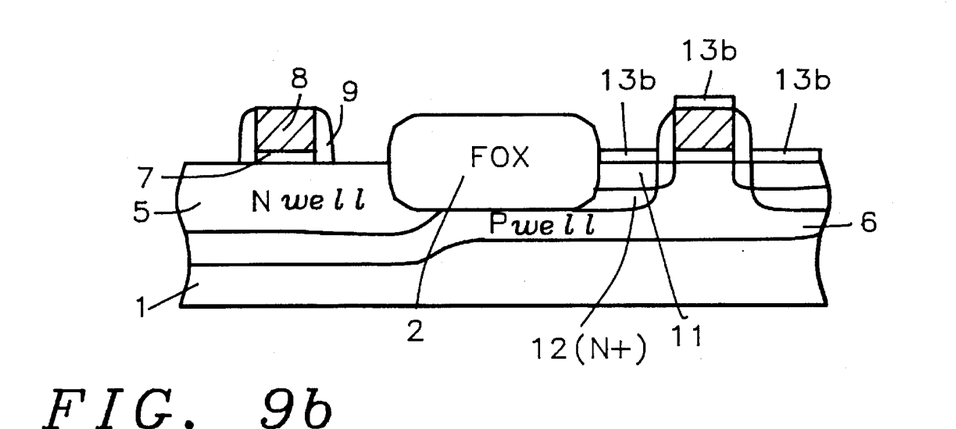

Two options can now be used to remove silicon dioxide layer, 13a, to prepare the N well region for the P+ source and drain process. The first option is shown in FIG. 9a, in which photoresist blockout, 14, is used to protect silicon dioxide layer, 13b, from a buffered hydrofluoric acid solution, used to remove silicon dioxide layer, 13a. The preferred option, shown in FIG. 9b, offers the savings of a photomasking step, via a controlled, blanket exposure to a buffered hydrofluoric acid solution. This procedure, including a 100% overetch, will remove the 100 to 200 Angstroms of silicon dioxide layer, 13a, while still leaving between about 200 to 400 Angstroms of silicon dioxide layer, 13b, available as a barrier for subsequent borosilicate glass, (BSG), procedures.

Figure 10:
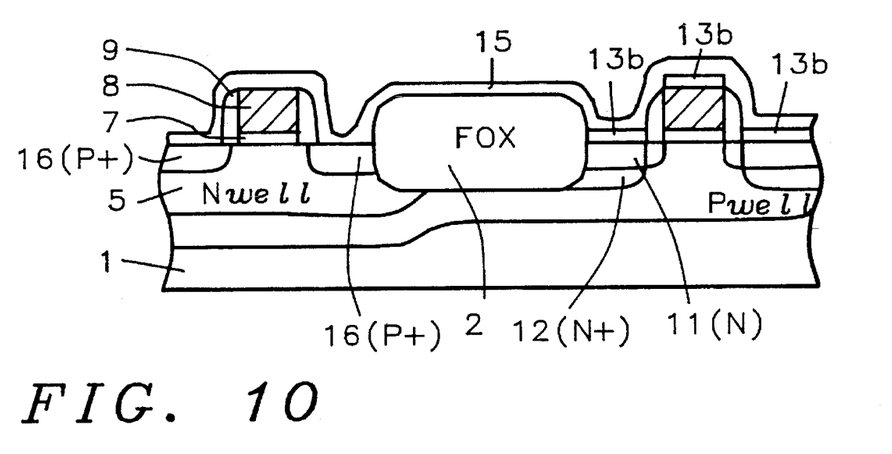
Figure 11:
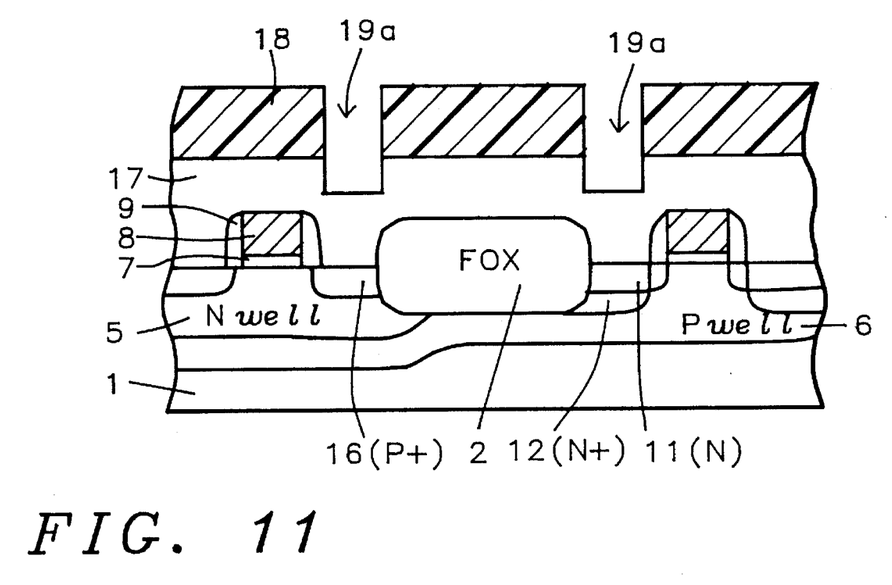
FIGS. 11–13, which schematically, in cross-sectional style, show the formation of the contact holes and metal structures, used for the CMOS device.

Next a layer of BSG, 15, is deposited using LPCVD processing, at a temperature between about 600° to 800° C., to a thickness between about 1000 to 2000 Angstroms, containing a boron content between about 2 to 5%. Another RTA procedure is performed at a temperature between about 1050° to 1150° C., for a time between about 30 to 90 seconds to drive boron from BSG layer, 15, and to form P+ source and drain regions, 16, in the N well region, 5. The silicon dioxide layer, 13b, did not allow the boron diffusion to occur in the N+ source and drain areas, 12. This is schematically shown in FIG. 10. BSG layer, 15, can then either be preserved on the surface, or removed, as shown in FIG. 11, via either a BHF or an ammonia peroxide procedure.

Figure 12:
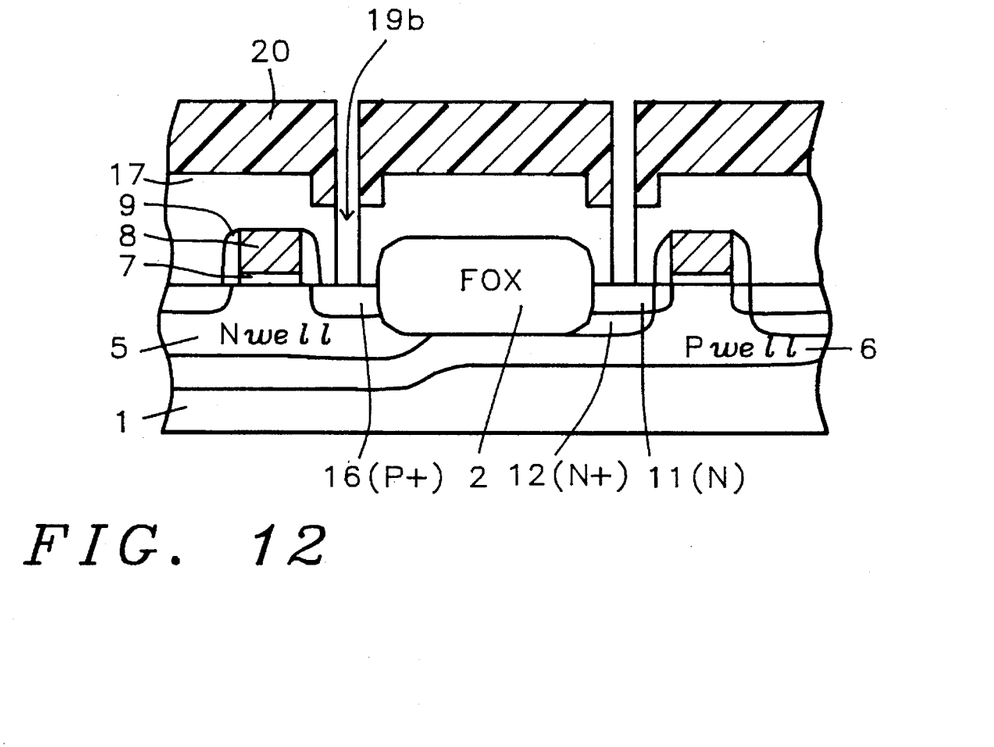
Figure 13:
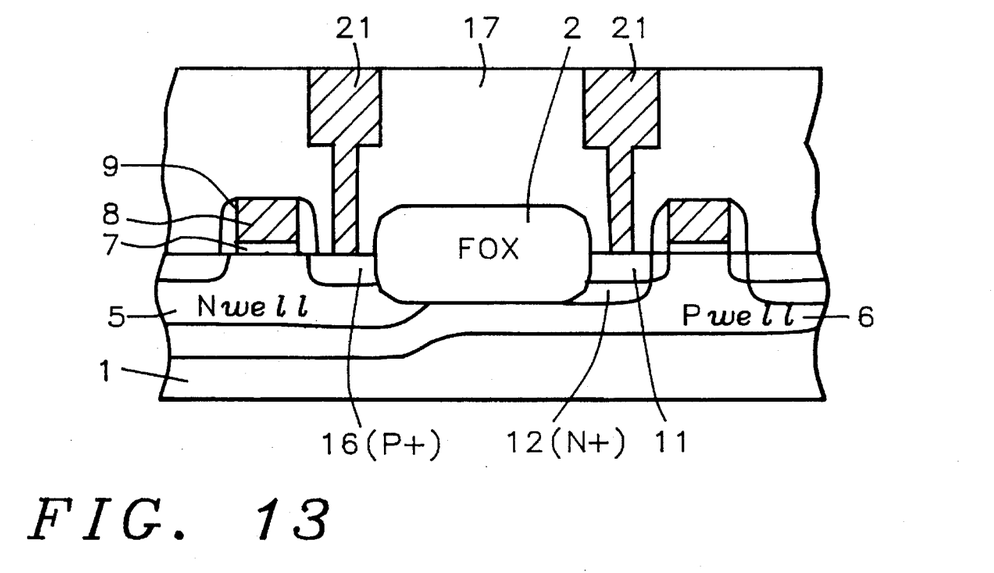

A silicon oxide layer, 17, is deposited using LPCVD or PECVD processing, at a temperature between about 400° to 700° C., to a thickness between about 10000 to 13000 Angstroms. A two stage contact hole, 19a and 19b, to source and drain regions, 12, and 16, is produced. First the use of photoresist layer, 18, allows a small diameter opening, 19a, to be created in silicon oxide layer, 17. The opening is created using anisotropic reactive ion etching, using CHF₃ as an etchant, to a depth of between about 4000 to 6000 Angstroms in silicon oxide layer, 17. This is shown in FIG. 11. Photoresist layer, 18, is then removed via plasma oxygen ashing, and careful wet cleans, followed by the application of another photoresist layer, 20. Photoresist layer, 20, is processed to supply image, 19b, significantly smaller than opening 19a, and transferred to underlying silicon oxide layer, 17, again via anisotropic, reactive ion etching, using CHF₃ as an etchant. This is shown in FIG. 12. After photoresist removal, once again via the use of plasma oxygen ashing and wet cleans, a metallization layer of aluminum—copper——silicon, is deposited using r.f. sputtering, or LPCVD tungsten is used, both at a thickness between about 5000 to 10000 Angstroms. Metal structure, 21, is then formed via selective reactive ion etching, using Cl₂ as an etchant, or via chemical mechanical polishing. Both procedures remove the metal and residuals from the surface of silicon oxide layer, 17. This is shown schematically in FIG. 13. The two stage contact hole opening, allows the contact to the source and drain regions to be made with the thin, stud type section of metallization structure, 21, while the wider section of metallization structure 21, is used for interconnect purposes.

This CMOS process, through first metal, can be accomplished using only six photomasking steps. Although this invention has been described for CMOS type devices, it should be understood that BiCMOS, (bipolar—CMOS), type devices, can also be fabricated using this invention.

While this invention has been particularly shown and described with reference to, the preferred embodiments thereof, it will be understood by those skilled in the art that various changes in form and detail may be made without departing from the spirit and scope of this invention.

What is claimed is:

1. A method for fabricating complimentary metal oxide semiconductor, (CMOS), devices, on a semiconductor substrate, comprising the steps of:

forming a field oxide region in a portion of said semiconductor substrate;

growing a first insulator layer on first and second regions of said semiconductor substrate, not covered by said field oxide region;

forming a photoresist well pattern on said first region of said semiconductor substrate;

firsts ion implanting a first conductivity imparting dopant into area of said semiconductor substrate, not covered by said photoresist well pattern, to form N well region;

second ion implanting a second conductivity imparting dopant through said photoresist well pattern into said semiconductor substrate, to form a P well region in said semiconductor substrate, underlying said photoresist well pattern and said N well region, while not interfering with said N well region, in area of said semiconductor substrate, not covered by said photoresist well pattern;

removing said photoresist well pattern after said second implanting;

third ion implanting a third conductivity imparting dopant into said semiconductor substrate including said well regions, not covered by said field oxide region;

removing of said first insulator layer after said third implanting;

growing a second insulator layer on said semiconductor substrate including said well regions, not covered by said field oxide region, to be used as a gate insulator;

depositing a polysilicon layer on said gate insulator, and on said field oxide regions;

fourth ion implanting a fourth conductivity imparting dopant into said polysilicon layer;

patterning said implanted polysilicon layer to form polysilicon gate structure;

depositing a third insulator layer on said polysilicon gate structure, on said gate insulator not covered by said polysilicon gate structure, and on said field oxide region;

anisotropic etching of said third insulator layer to form an insulator sidewall spacer on sides of said polysilicon gate structure;

forming a photoresist P well pattern on said N well region and to expose said P well region;

fifth ion implanting a fifth conductivity imparting dopant into said P well region, not covered by said polysilicon gate structure, but including ion implantation under said insulator sidewall spacer, to form lightly doped source and drain regions;

sixth ion implanting a sixth conductivity imparting dopant into said P well region, not covered by said polysilicon gate structure, and not covered by said insulator sidewall spacer, to form heavily doped source and drain regions;

removing of said photoresist P well pattern after said sixth implanting;

growth of a thick fourth insulator layer on said heavily doped source and drain regions, in said P well region, while growing a thinner fourth insulator layer in N well region, not covered by said polysilicon gate structure;

removing said thinner fourth insulator layer from said N well region, while leaving some said thick fourth insulator layer on said heavily doped source and drain regions in said P well region;

deposition of a borosilicate glass layer on same said thick fourth insulator layer, over said heavily doped source and drain regions, in said P well region, and on said N well region;

rapid thermal annealing to form heavily doped source and drain regions in N well region, not covered by said polysilicon gate structure;

removing said borosilicate glass layer, and some said thick fourth insulator layer, over said heavily doped source and drain regions in P well region after said annealing;

depositing a fifth insulator layer on said P well, and said N well regions;

forming an initial phase photoresist pattern on said fifth insulator layer, with a wide opening in a first photoresist layer, directly overlying said heavily doped source and drain regions of both said N well region, and said P well region;

anisotropic etching, to remove only a top portion of said fifth insulator layer, in said wide opening in said first photoresist layer, to create a wide hole opening, extending partially into said fifth insulator layer;

removing said initial phase, photoresist pattern after forming said wide hole opening;

forming a second phase photoresist pattern on said fifth insulator layer, with a narrow opening in a second photoresist layer, exposing said wide hole opening in said fifth insulator layer, directly overlying said heavily doped source and drain regions of both said N well region, and said P well region;

anisotropic etching of said fifth insulator layer, in said narrow opening in said second photoresist layer, to create a contact hole to said heavily doped region in said N well region, and to said heavily doped source and drain regions in said P well region, with a narrow opening at the bottom of said contact hole, and a wide opening at the top of said contact hole;

removing said second phase, photoresist pattern after forming said contact hole; and depositing a metallization layer, and etching said metallization layer to a metal structure.

2. The method of claim 1, wherein said first conductivity imparting dopants, used to form said N well region, are arsenic, ion implanted at an energy between about 100 to 300 Kev., at a dose between about 1E11 to 1E12 atoms/$^2$, and phosphorous, ion implanted at an energy between about 400 to 1000 Kev., at a dose between about 1E12 to 1E13 atoms/cm$^2$.

3. The method of claim 1, wherein said second conductivity imparting dopant, used to form said P well region, is boron, ion implanted at an energy between about 1000 to 2000 Kev., at a dose between about 1E12 to 1E13 atoms/$^2$.

4. The method of claim 1, wherein said third conductivity imparting dopant, used for threshold voltage adjustment, is $BF_2$, ion implanted at an energy between about 20 to 60 Kev., at a dose between about 1E11 to 1E12 atoms/$^2$.

5. The method of claim 1, wherein said gate insulator is silicon dioxide, thermally grown in an oxygen—steam ambient, at a temperature between about 850° to 950° C., to a thickness between about 50 to 200 Angstroms.

6. The method of claim 1, wherein said polysilicon layer is deposited using LPCVD processing, at a temperature between about 550° to 650° C., to a thickness between about 2000 to 4000 Angstroms.

7. The method of claim 1, wherein said third insulator layer, used for said insulator sidewall spacer, is silicon oxide, deposited using either LPCVD or PECVD processing at a temperature between about 400° to 700° C., to a thickness between about 1000 to 3000 Angstroms, using tetraethylorthosilicate as a source.

8. The method of claim 1, wherein said insulator sidewall spacer is formed via anisotropic, reactive ion etching of said third insulator layer, using $CHF_3$ as an etchant.

9. The method of claim 1, wherein said fifth conductivity imparting dopant, used to create said lightly doped source and drain region in said P well region, is phosphorous, ion implanted at an energy between about 40 to 100 Kev., at a dose between about 1E13 to 1E14 atoms/$^2$, and at an implant angle between about 30° to 60°, needed to place said phosphorous under said insulator sidewall spacer.

10. The method of claim 1, wherein said sixth conductivity imparting dopant, used to create said heavily doped source and drain regions in said P well region, is arsenic, ion implanted at an energy between about 50 to 100 Kev., at a dose between about 1E15 to 5E15 atoms/$^2$, at an implant angle between about 0° to 7°.

11. The method of claim 1, wherein said fourth insulator layer is silicon dioxide, thermally grown in an oxygen—steam ambient at a temperature between about 600° to 800° C., to a thickness between about 100 to 200 Angstroms on said N well region, and to a thickness between about 400 to 800 Angstroms on said heavily doped source and drain regions, in said P well region.

12. The method of claim 1, wherein said fourth insulator layer, on said N well region, is removed via use of a buffered hydrofluoric acid solution.

13. The method of claim 1, wherein said borosilicate glass layer is deposited using LPCVD processing, at a temperature between about 600° to 800° C., to a thickness between about 1000 to 2000 Angstroms, with a boron content between about 2 to 5%.

14. The method of claim 1, wherein said rapid thermal annealing, used to create said source and drain regions in N well region, is performed at a temperature between about 1050° to 1150° C., for a time between about 30 to 90 seconds.

15. The method of claim 1, wherein said contact hole to said heavily doped source and drain region of said P well region, and to said source and drain region of said N well region, is created via a two stage photolithographic and reactive ion etching process, using $CHF_3$ as an etchant, resulting in a narrow opening at the bottom of said contact hole, and a wide opening at the top of said contact hole.

16. A method for fabricating CMOS devices, on a semiconductor substrate, through a first level metallization, using only six photomasking steps, comprising the steps of:

depositing an oxidation resistant insulator an said substrate;

forming a first photoresist pattern on said oxidation resistant insulator;

anisotropic, reactive ion etching of said oxidation resistant insulator, using first photoresist pattern as a mask, to form an oxidation resistant insulator mask;

removing said first photoresist pattern after forming said insulator mask;

forming a field oxide region in said semiconductor substrate, in region not covered by said oxidation resistant insulator mask;

removing said oxidation resistant insulator mask after forming said field oxide region;

growing a first insulator layer on first and second regions of said semiconductor substrate, not covered by said field oxide region;

forming a second photoresist pattern on said first region of said semiconductor substrate;

first ion implanting a first conductivity imparting dopant into said semiconductor substrate, not covered by said second photoresist pattern, to form a N well region;

second ion implanting a second conductivity imparting dopant into said semiconductor substrate, to form a P well region, in said semiconductor substrate underlying said second photoresist pattern and said N well region, while not interfering with said N well region of said semiconductor substrate, not covered by said second photoresist pattern;

removing said second photoresist pattern after said second implanting;

third ion implanting a third conductivity imparting dopant into said semiconductor substrate including said well regions, not covered by said field oxide region, for threshold voltage adjustment;

removing said first insulator layer after third implanting;

growing a second insulator layer on said semiconductor substrate including said well regions, not covered by said field oxide region, to be used as a gate insulator;

depositing a polysilicon layer on said gate insulator, and on said field oxide region;

fourth ion implanting a third conductivity imparting dopant into said polysilicon layer;

forming a third photoresist pattern on said implanted polysilicon layer;

anisotropic, reactive ion etching of said implanted polysilicon layer, using said third photoresist pattern as a mask, to form a polysilicon gate structure;

removal of said third photoresist pattern;

depositing a third insulator layer on said polysilicon gate structure, on said gate insulator, not covered by said polysilicon gate structure, and on said field oxide region;

anisotropic, reactive ion etching of said third insulator layer to form an insulator sidewall spacer on sides of said polysilicon gate structure;

forming a fourth photoresist pattern on said N well region and, to expose said P well region;

fifth ion implanting a fifth conductivity imparting dopant into said P well region, not covered by said polysilicon gate structure, but including ion implantation under said insulator sidewall spacer, to form N type, lightly doped source and drain regions;

sixth ion implanting a sixth conductivity imparting dopant into said P well region, not covered by said polysilicon gate structure, and not covered by said insulator sidewall spacer, to form N type, heavily doped source and drain regions;

removing said fourth photoresist pattern after said sixth implanting;

growth of a thick fourth insulator layer on said N type, heavily doped source and drain regions, while growing a thinner fourth insulator in N well region, not covered by said polysilicon gate structure;

removing said thinner fourth insulator layer from said N well region, while leaving some said thick fourth insulator layer on said N type, heavily doped source and drain regions;

deposition of a borosilicate glass layer on some said thick fourth insulator layer, over said N type, heavily doped source and drain region, and on said N well region;

rapid thermal annealing to create P type, heavily doped source and drain region in said N well region, not covered by said polysilicon gate structure;

removing of said borosilicate glass layer, and some said thick fourth insulator layer, over said N type, heavily doped source and drain regions after said annealing;

depositing a fifth insulator layer on said P well and said N well regions;

forming a fifth photoresist pattern on said fifth insulator layer, with a wide opening in a first photoresist layer, directly over said P type, heavily doped source and drain regions, and directly over said N type, heavily doped source and drain regions;

anisotropic, reactive ion etching, to remove only a portion of said fifth insulator layer, in said wide opening in said first photoresist layer, to create a wide hole opening, extending partially into said fifth insulator layer;

removing said fifth photoresist pattern after forming said via hole opening;

forming a sixth photoresist pattern on said fifth insulator layer, with a narrow opening in a second photoresist layer, exposing said wide hole opening in said fifth insulator layer, and directly over said N type, heavily doped source and drain region, and directly over P type, heavily doped source and drain region;

anisotropic reactive ion etching, of said fifth insulator layer, in said narrow opening in said second photoresist layer, to create a contact hole to said P type, heavily doped source and drain region, and to N type, heavily doped source and drain region, with a narrow opening at bottom of said contact hole, and a wide opening at the top of said contact hole;

removing said sixth photoresist pattern;

depositing a metallization layer, and etching said metallization layer to of a metal structure.

17. The method of claim 16, wherein said first conductivity imparting dopants, used to form said N well region, are arsenic, ion implanted at an energy between about 100 to 300 Kev., at a dose between about 1E11 to 1E12 atoms/$^2$, and phosphorous, ion implanted at an energy between about 400 to 1000 Kev., at a dose between about 1E12 to 1E13 atoms/$^2$.

18. The method of claim 16, wherein said second conductivity imparting dopant, used to form said P well region, is boron, ion implanted at an energy between about 1000 to 2000 Kev., at a dose between about 1E12 to 1E13 atoms/$^2$.

19. The method of claim 16, wherein said third conductivity imparting dopant, used for threshold voltage adjustment, is $BF_2$, ion implanted at an energy between about 20 to 60 Kev., at a dose between about 1E11 to 1E12 atoms/$^2$.

20. The method of claim 16, wherein said gate insulator is silicon dioxide, thermally grown in an oxygen—steam ambient, at a temperature between about 850° to 950° C., to a thickness between about 50 to 200 Angstroms.

21. The method of claim 16, wherein said polysilicon layer is deposited using LPCVD processing, at a temperature between about 550° to 650° C., to a thickness between about 2000 to 4000 Angstroms.

22. The method of claim 16, wherein said third insulator layer, used for said insulator sidewall spacer, is silicon oxide, deposited using either LPCVD or PECVD processing, at a temperature between about 400° to 700° C., to a thickness between about 1000 to 3000 Angstroms, using tetraethylorthosilicate as a source.

23. The method of claim 16, wherein said insulator sidewall spacer is formed via anisotropic, reactive ion etching of said third insulator layer, using $CHF_3$ as an etchant.

24. The method of claim 16, wherein said fifth conductivity imparting dopant, used to create said N type, lightly doped source and drain region, is phosphorous, ion implanted at an energy between about 40 to 100 Kev., at a dose between about 1E13 to 1E14 atoms/$^2$, and at an implant angle between about 30° to 60°, needed to place phosphorous under said insulator sidewall spacer.

25. The method of claim 16, wherein said sixth conductivity imparting dopant, used to create said N type, heavily doped source and drain region, is arsenic, ion implanted at an energy between about 50 to 100 Kev., at a dose between about 1E15 to 5E15 atoms/$^2$, and at an implant angle between about 0° to 7°.

26. The method of claim 16, wherein said thick fourth insulator layer, grown on said N type, heavily doped source and drain region, is silicon dioxide, thermally grown in an oxygen—steam ambient, at a temperature between about 600° to 800° C., to a thickness between about 400 to 800 Angstroms, while said thin fourth insulator layer, of silicon dioxide, is grown on said N well region, to a thickness between about 100 to 200 Angstroms.

27. The method of claim 16, wherein said thin fourth insulator layer, on said N well region, is removed via use a buffered hydrofluoric acid solution.

28. The method of claim 16, wherein said borosilicate glass layer is deposited using LPCVD processing, at a temperature between about 600° to 800° C., to a thickness between about 1000 to 2000 Angstroms, with a boron content between about 2 to 5%.

29. The method of claim 16, wherein said rapid thermal annealing, used to create P type, heavily doped source and drain regions, is performed at a temperature between about 1050° to 1150° C., for a time between about 30 to 90 seconds.

30. The method of claim 16, wherein said contact hole to said P type, heavily doped source and drain region, and to said N type, heavily doped source and drain region, is created via a two stage photolithographic and reactive ion etching process, using $CHF_3$ as an etchant, resulting in a wide opening, between about 1.0 to 1.3 μM, at the top of said contact hole, and a narrow opening, between about 0.4 to 0.6 μM, at the bottom of said contact hole.

\* \* \* \* \*